United States Patent [19]

Hannes et al.

[11] 4,392,301

[45] Jul. 12, 1983

[54] DEVICE FOR INSERTING AND REMOVING CIRCUIT MODULES WITH MULTIPLE LEADS

[75] Inventors: John S. Hannes, Lisle; Robert V. Harringer, Joliet, both of Ill.

[73] Assignee: Western Electric Company, Inc., New York, N.Y.

[21] Appl. No.: 268,612

[22] Filed: Jun. 1, 1981

[51] Int. Cl.³ .................... H05K 13/04; H05K 3/30
[52] U.S. Cl. ........................................ 29/741; 29/758; 29/764
[58] Field of Search .............. 29/741, 739, 764, 758, 29/278, 261, 837–839

[56] References Cited

U.S. PATENT DOCUMENTS

| | | | |
|---|---|---|---|
| 3,443,297 | 5/1969 | Lusby, Jr. | 29/764 |
| 3,516,142 | 6/1970 | De Rose et al. | 29/764 X |
| 3,538,580 | 11/1970 | Bruner | 29/764 X |
| 3,699,629 | 10/1972 | Hood, Jr. et al. | 29/764 |
| 3,797,092 | 3/1974 | Einarson | 29/764 X |
| 3,974,556 | 8/1976 | Kubik | 29/764 |
| 4,033,032 | 7/1977 | Romania et al. | 29/764 |
| 4,152,827 | 5/1979 | Walton | 29/764 |

*Primary Examiner*—Carl E. Hall
*Attorney, Agent, or Firm*—K. R. Bergum; R. P. Miller

[57] ABSTRACT

A device for removing leads (14) of a circuit module (12) from sockets (16) mounted in a circuit board (18) includes a first assembly (51, 52 and 54) having two depending arrays of fingers which engage the socket (16) and a second assembly (34) having two arrays of pivotally mounted jaws (31 and 32) which are manipulated to grip opposite sides of the circuit module. The second assembly is movably mounted within the first assembly, and when moved upwardly away from the circuit board, acts to pull the circuit module to extract the leads from the sockets while the fingers hold the sockets from dislodgement from the board. The fingers are longitudinally grooved (61) to guide the leads during extraction from the sockets.

11 Claims, 10 Drawing Figures

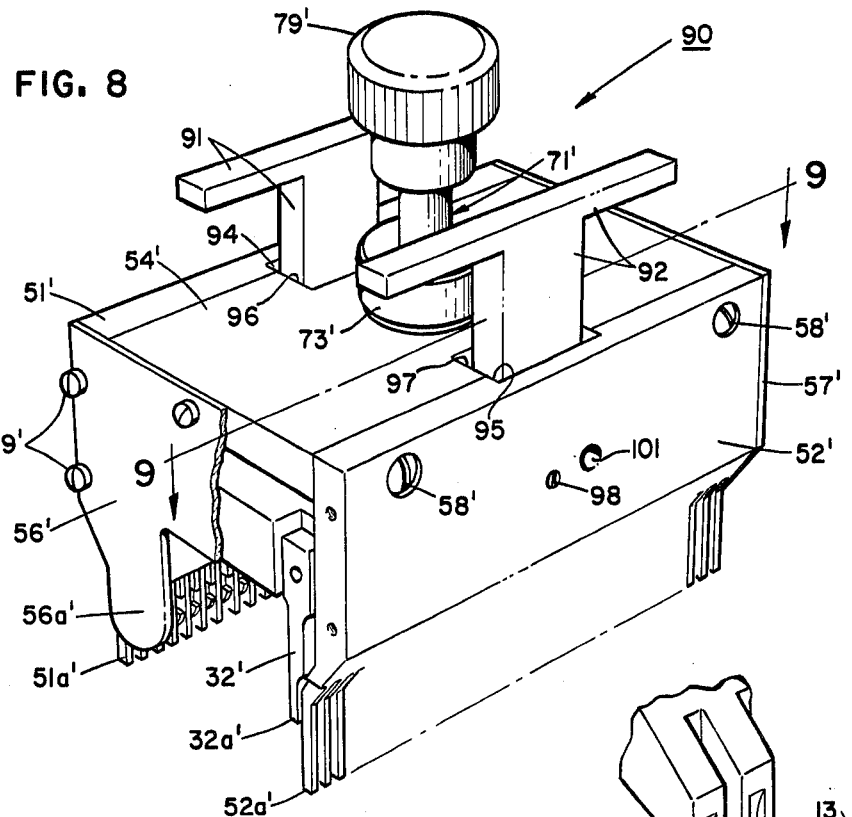
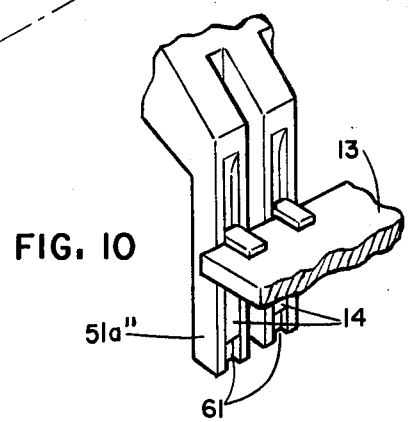
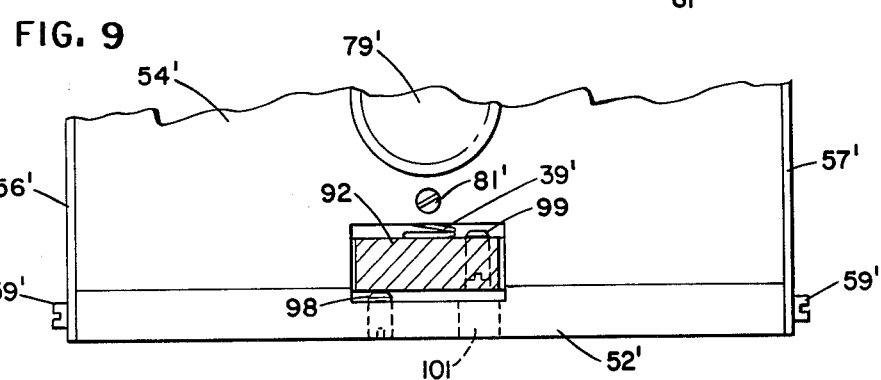

DEVICE FOR INSERTING AND REMOVING CIRCUIT MODULES WITH MULTIPLE LEADS

FIELD OF THE INVENTION

This invention relates to a device for handling circuit modules with multiple leads and, more particularly, to such a device applicable for use in inserting the leads of such modules into or withdrawing them from aligned lead-engaging circuit board-mounted sockets.

BACKGROUND OF THE INVENTION

In the assembly and repair of complex circuit modules typically having dual-in-line leads that extend downwardly therefrom, considerable care must normally be taken during the insertion of the leads into, or their extraction out of, an associated socket (or connector) so as to neither damage the leads nor the circuit module itself. More specifically, non-linear displacement of the circuit module, particularly as a result of non-uniformly distributed displacement forces being imparted thereagainst, can readily cause detrimental bending or twisting of the leads, or induce stress fractures (cracks) in the body portion of a circuit module, especially when the latter is of the type incorporating a relatively fragile circuit-supporting substrate.

A very serious problem has arisen in this regard with respect to circuit modules of the so-called hybrid integrated circuit (HIC) type employing thin film circuitry fabricated on a relatively thin, fragile circuit-supporting ceramic substrate. In one such circuit module (or assembly), the ceramic substrate measures 1600 mils in width, 3600 mils in length and 62 mils in thickness, with 36 ribbon-like leads extending downwardly from, and disposed along each of the two longest mutually disposed sides of the substrate to form a dual-in-line configuration. The leads in the illustrative circuit module each have a width of 30 mils, a thickness of 15 mils, and a centerline-to-centerline spacing of 100 mils.

It becomes readily apparent that such circuit modules are not only relatively fragile with respect to the substrate and leads, in particular, but generally are quite expensive, the actual cost depending primarily on the nature and density of the circuitry forming the major part thereof, but often being in the range of $200.00 to $500.00 each. Considerable care is thus required in handling such circuit modules during their lead insertion into or extraction out of associated sockets (or connectors), the latter typically being secured to a common support member, such as a circuit board.

There have been a number of tools or devices designed and employed heretofore to insert and/or remove multi-leaded circuit modules of various types from associated lead-engaging sockets. However, none of such known prior devices has incorporated a universal pair of segmented gripping jaws that not only would accommodate circuit modules of different widths, but would uniformly distribute either linearly directed insertion or extraction forces against a gripped circuit module, as a result of being precisely displaced mechanically relative to a stationary frame or stop member portion of the device.

Moreover, no previously known mechanically operated device of the type of particular concern herein has incorporated a stationary socket-abutting portion that cooperates with associated displaceable and pivotal gripping jaws to establish, and confine, mechanically generated extraction forces between only a gripped socket-mounted circuit module and the sockets per se. Only in this way can an extraction (or insertion) device be isolated from a socket-supporting circuit board, or substrate, which isolation may often be dictated by high density circuitry-space constraints, or by surface fabricated wiring that is easily damaged if scratched or otherwise marred by any object brought into contact therewith.

SUMMARY OF THE INVENTION

It, therefore, is an object of the present invention to provide a device which, without any modification, is adapted to either insert or remove the leads of a multi-leaded circuit module, particularly of the type having a relatively fragile circuit-supporting substrate and dual-in-line leads, into or out of an aligned pair of lead-engaging circuit board-mounted sockets, and with precise, mechanically controlled linear displacement being effected between the circuit module and the associated sockets, while the device abuts against only the latter, so as to prevent any possible damage to the leads, circuit module per se, or associated circuit board.

In accordance with the principles of the present invention, the above and other objects are realized in one preferred illustrative embodiment wherein a multi-leaded circuit module insertion and/or removal device comprises a first pair of mutually disposed, pivotally mounted and spring biased gripping jaws, a correspondingly disposed pair of stationary, socket-abutting stop members, and a rotatably actuated wheel-puller mechanism, the latter being adapted for displacing the gripping jaws relative to the stop members.

Each associated jaw and stop member is segmented in comb-like fashion along a lower longitudinally disposed end portion thereof, with each array of jaw segments in the illustrative embodiments of the invention preferably being at least partially interleaved with the associated array of stop member segments. Each array of jaw segments is further interleaved with an adjacent array of circuit module leads when the former are spring-biased inwardly to grip spaced peripheral edge portions of a circuit module. To that end, the inner surface of each jaw segment is preferably formed with a circuit module edge-receiving notch.

In operation, the gripping jaws are initially manually biased apart sufficiently to receive a circuit module therebetween, with the jaws thereafter being allowed to close (under spring-bias) until the notched regions in the segments thereof respectively nest different longitudinally spaced peripheral edge portions of the circuit module (or substrate thereof) on three sides. The jaw segments thus effectively distribute the forces thereafter applied against the circuit module while the leads thereof are either forced into aligned circuit board-mounted sockets or withdrawn therefrom, in response to the proper rotation of the wheel-puller mechanism, which effects the necessary linear displacement of the gripping jaws relative to the intercoupled stationary socket-abutting stop members.

BRIEF DESCRIPTION OF THE DRAWINGS

FIG. 8 is a perspective view of a second illustrative embodiment of a device for inserting or removing the leads of multi-leaded circuit modules into or out of circuit board-mounted sockets, and distinguishes over the first embodiment of FIG. 1 only with respect to the configuration of the upper handle portion of each gripping jaw, and the provision of two adjustable stop details for controlling both the inward and outward pivotal movement of the lower segmented portions of the jaws relative to each other;

FIG. 9 is an enlarged, fragmentary sectional view, taken along the line 9—9 of FIG. 8, illustrating the physical relationship between the upward extending handle portion of one of the jaws relative to the biasing spring and two stop details associated therewith, and FIG. 10 is an enlarged, fragmentary perspective view of two adjacent modified stop member fingers, applicable for use in the devices of FIGS. 1 and 8, each formed with an elongated groove that communicates with the inner surface thereof, and dimensioned to confine a relatively fragile circuit module lead on three sides, particularly during the linear insertion thereof into an aligned receptacle of a socket.

DETAILED DESCRIPTION OF THE INVENTION

It should be appreciated that while the invention is described in detail herein primarily in regard to the insertion or extraction of the leads of a substrate-based, multi-leaded circuit module into or out of aligned, and supported, lead-engaging sockets, the preferred illustrative device embodiments for carrying out such operations are equally applicable for use with many other types of multi-leaded circuit assemblages. Accordingly, general reference to a "circuit module" herein is intended to embrace conventional dual-in-line packages (DIPS), flat packs, circuit packs, circuit cards or chip carriers, as well as otherwise broadly defined multi-leaded electronic components, devices, assemblies or packages.

Figure 1:
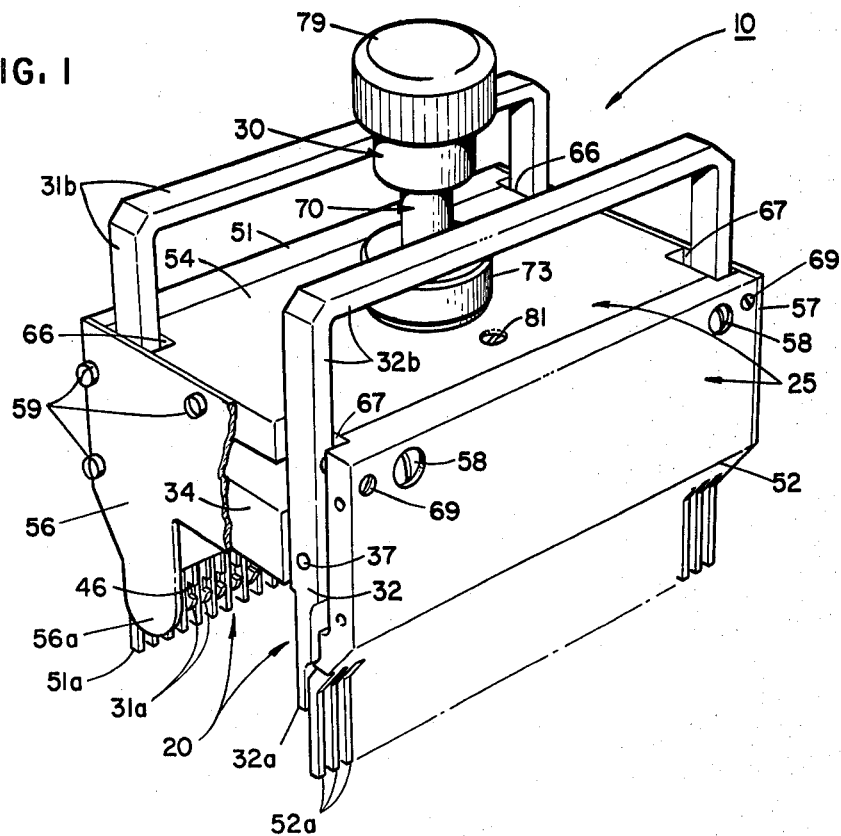
FIG. 1 is a perspective view of a first illustrative embodiment of a device for inserting or removing the leads of multi-leaded circuit modules, particularly of the type having a relatively fragile circuit-supporting substrate and dual-in-line leads, into or out of circuit board-mounted sockets, said device embodying the principles of the present invention.
Figure 3:
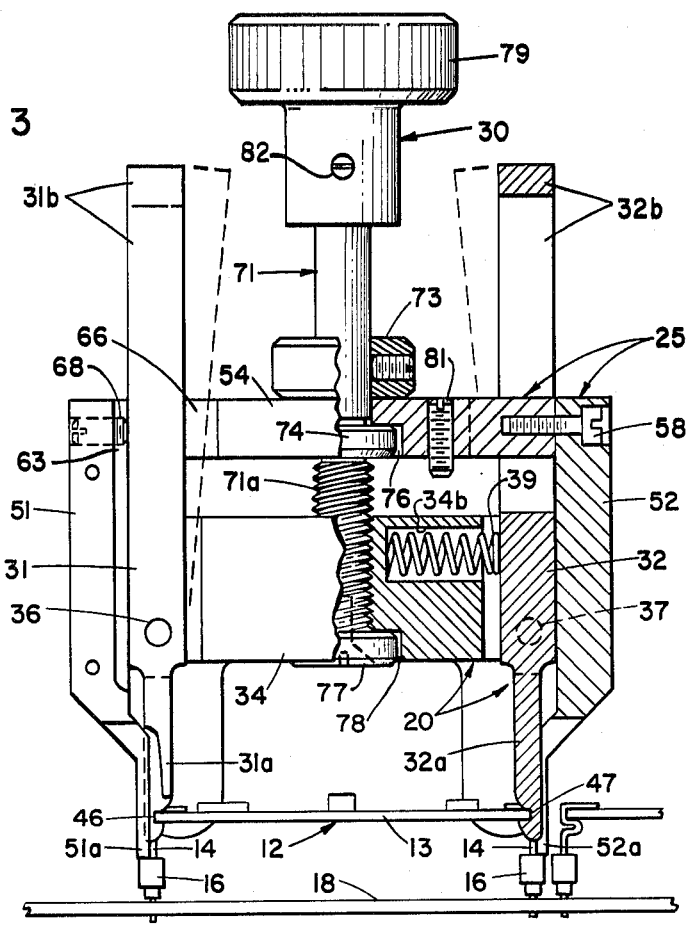
FIG. 3 is an enlarged end view, partially in section, of the device of FIG. 1, illustrating in greater detail the construction of the gripping jaw and stop member assemblies, and of the interconnecting rotatable wheel-puller mechanism, while such structural elements are in relative positions preparatory to extracting the leads of a representative circuit module from a pair of lead-engaging sockets mounted on a circuit board.

With particular reference first to FIGS. 1 and 3, there is illustrated a device 10 which is adapted for inserting or removing a circuit module 12, of the type having a relatively fragile circuit-supporting substrate 13 and dual-in-line leads 14, into or out of an aligned pair of lead-engaging sockets 16, normally permanently secured to an associated circuit board 18. As previously noted, one such circuit module with which the subject device has proven to have particularly advantageous utility, is more specifically described as a thin film hybrid integrated circuit module that utilizes a relatively thin, and fragile circuit-supporting ceramic substrate. With such a substrate, any non-uniformly distributed displacement forces imparted thereagainst can readily cause either the chipping or cracking thereof, often resulting in the total loss of such a circuit module.

Figure 2:
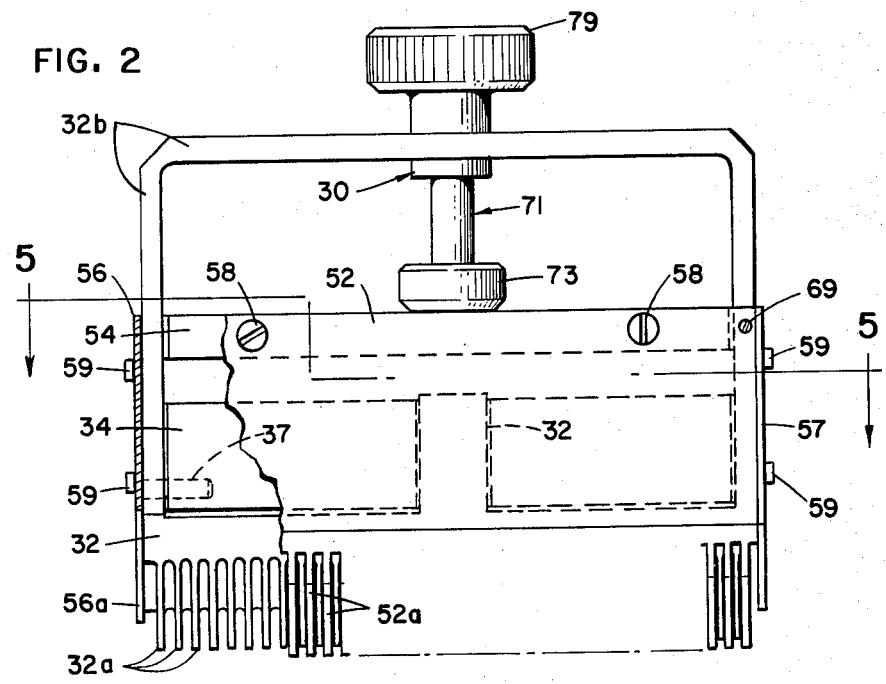
FIG. 2 is a side view, partially broken away, of the device of FIG. 1.

With specific reference now to the device 10 itself, as best seen in FIGS. 1-3, in particular, it comprises a gripping jaw assembly, designated generally by the reference numeral 20, which is adapted for linear movement relative to a composite stationary frame and stop member assembly, designated generally by the reference numeral 25. The desired relative displacement between the gripping jaw and composite frame and stop member assemblies 20 and 25 respectively, is effected by a rotatably actuated wheel-puller mechanism 30.

The gripping jaw assembly 20 includes a mutually disposed pair of longitudinally extending, pivotally mounted and spring-biased gripping jaws 31, 32, and a support member 34 interposed therebetween. The gripping jaws 31, 32 are pivotally mounted on opposite side regions of the support member 34 by respective pairs of pins 36, 37, each being suitably secured within a receiving bore formed in the support member.

Figure 5:
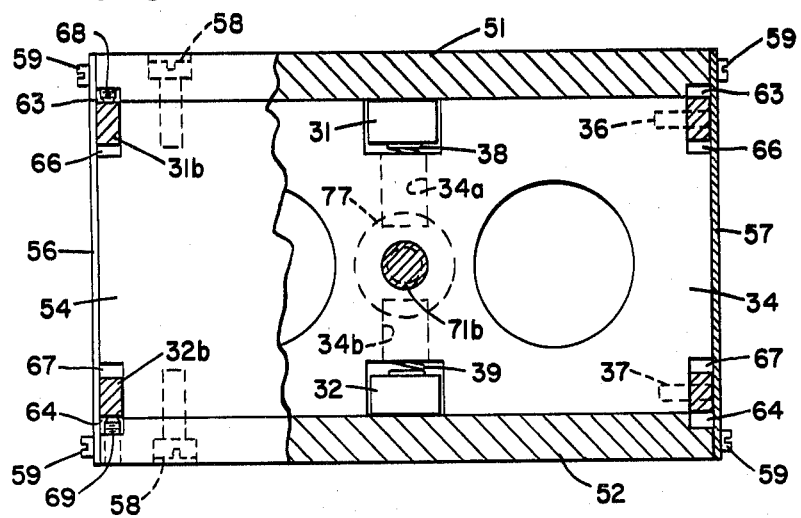
FIG. 5 is a sectional view of the device of FIG. 1, taken along the line 5—5 of FIG. 2, illustrating in greater detail the physical relationship of certain of the structural features of the device as depicted selectively in FIGS. 1-4.

As best seen in FIGS. 3 and 5, the lower portion of each jaw 31 or 32 is normally biased in a direction toward the other jaw by means of a respectively associated coil spring 38 or 39 which compressively biases against an inner surface of the associated jaw in a region above the pivot point thereof. The major portion of each coil spring is seated within a bore 34a or 34b formed in the displaceable support member 34.

In accordance with an aspect of the present invention, the lower longitudinally disposed portion of each pivotal jaw 31 or 32 is formed into a comb-like array of downwardly extending jaw segments 31a or 32a. The segments in each array are dimensioned and spaced so as to allow the respective ones thereof to extend between different adjacent pairs of leads 14 supported on the circuit module substrate 13, when the latter is positioned between, and gripped by, the jaw segments 31a and 32a (best seen in FIGS. 6 and 8).

Figure 4:
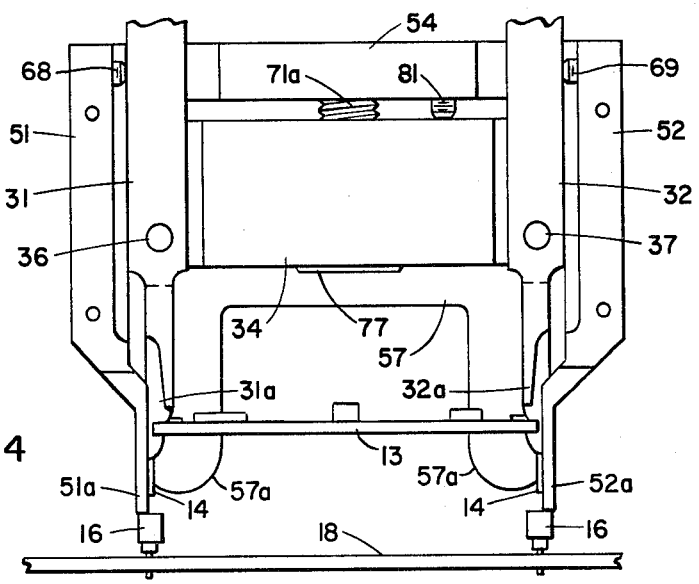
FIG. 4 is an enlarged, fragmentary end view similar to that of FIG. 3, but distinguishing therefrom by showing the spring-biased and pivotal gripping jaws after having been linearly displaced upwardly relative to the stationary stop members, by the rotatable wheel-puller mechanism, so as to have effected the extraction of the leads of a circuit module from a pair of associated circuit board-mounted sockets.
Figure 7:
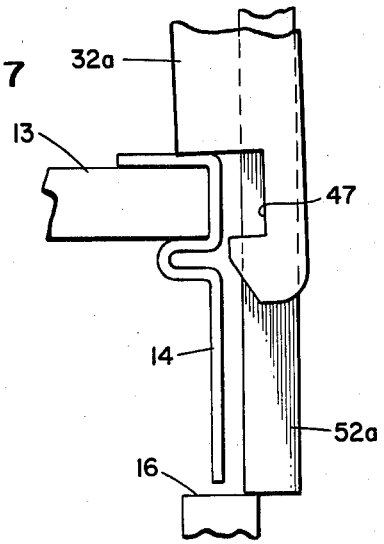
FIG. 7 is an enlarged, fragmentary detail view of one stop member finger and of the notched portion of one gripping jaw segment just prior to the latter gripping an edge portion of a circuit module substrate, which edge portion is interposed between a pair of downwardly extending circuit module leads (only one shown)

As depicted in FIGS. 3, 4 and 7, each gripping jaw segment 31a or 32a is also formed with a recessed notch 46 or 47 that communicates with the inner surface and is positioned near the terminating end, thereof. Each notch is dimensioned so as to allow an edge portion of the substrate 13 (or any other body portion of a given circuit module) to be confined on three sides while nested therewithin. As thus confined, uniformly distributed displacement forces can be advantageously exerted against the circuit substrate in a direction either downwardly or upwardly so as to effect either the insertion of the substrate-supported leads 14 into, or their extraction out of, the aligned pair of circuit board-mounted sockets (or connectors) 16. As such, different interchangeable jaw segments are advantageously not required for circuit module insertion versus extraction operations.

The upper portion of each gripping jaw 31, 32 is formed into a U-shaped, longitudinally disposed handle portion 31b or 32b in the first illustrative embodiment of the device, as best seen in FIGS. 1 and 2. The two handle portions are spaced apart such that they may be readily manually grasped and, in response to light compressive force applied thereagainst, moved inwardly toward each other, in opposition to the normal spring-biased forces exerted thereagainst. This results in the spacing between the gripping jaw segments 31a, 32a being increased sufficiently to allow multi-leaded circuit modules of different widths to be interposed between, and subsequently temporarily gripped by, the jaw segments.

Attention is now directed to the composite stationary frame and stop member assembly 25, which includes two mutually disposed sidewall-defining stop members 51, 52, an upper cross-member 54 and two end plates 56, 57, all integrally connected by either fastening member 58 or 59, as best seen in FIGS. 1, 3 and 5.

With particular reference to the stop members 51, 52, and in accordance with an aspect of the invention, a lower longitudinally disposed portion of each member is formed into a comb-like array of downwardly extending segments or fingers 51a or 52a. The fingers in each array are dimensioned and laterally spaced so as to allow the pivotal jaw segments 31a or 32a in the associated array to be interleaved therewith.

Figure 6:
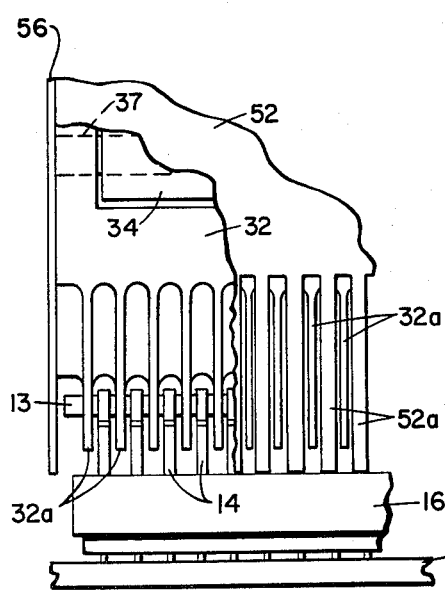
FIG. 6 is an enlarged, detail fragmentary view, partially in section, illustrating in greater detail the interleaved relationship of the spring-biased, pivotal gripping jaw segments relative to both the associated stop member fingers and the adjacent downwardly extending leads of a gripped circuit module substrate in accordance with the principles of the present invention.

Such an arrangement provides a number of significant advantages. First, it allows the terminating ends of the two mutually disposed arrays of stop member fingers 51a and 52a to be respectively aligned with different ones of a pair of associated sockets 16 and, in particular, with upper and outer marginal surface regions of the housings thereof, as best seen in FIG. 6. The width of these marginal regions are actually defined by the spacing between the peripheral edge of each of the longitudinally disposed array of receptacles (not shown) formed in each socket housing and the immediately adjacent outer and upper edge of the housing.

Thus, by properly positioning and dimensioning the length of the stop member fingers 51a and 52a relative to the respectively associated gripping jaw segments 31a, 32a, the fingers can be readily positioned on the respectively aligned socket housings so as to provide positive support for the composite stationary portion of the device 10 during a circuit module lead insertion or extraction operation. What is of particular significance in this regard is that no part of the device 10 need contact the upper surface of an associated circuit board 18, which may have components or devices mounted thereon, or printed or thin film circuitry fabricated thereon, in the immediate area surrounding the sockets. Should that not present a problem in a given application, it becomes readily apparent, of course, that the stop members 51a, 52a could be readily dimensioned and positioned so as to abut against the associated circuit board, or against any other type of supporting substrate, if desired. In the latter case, however, the forces imparted against a given circuit module during the extraction thereof from a pair of sockets would disadvantageously also be transmitted directly to the socket-circuit board interfaces.

A second advantage derived from the offset relationship that exists between the associated arrays of gripping jaw segments 31a, 32a and the stop member fingers 51a, 52a is that each of the fingers may thus be either partially or completely interleaved with the immediately adjacent jaw segments, or set back slightly, or set forward slightly from such jaw segments, while still offset, as desired, or required, for a given circuit module lead insertion or extraction application.

Such flexibility in stop member finger placement is further enhanced by the fact that in situations where the corresponding lead and socket receptacle spacings are extremely close, such as encountered in high density, complex electronic circuitry, both the jaw segments 31a, 32a and stop member fingers 51a, 52a may be formed with exceedingly small, knife-like width dimensions, particularly when made of hardened and ground tool steel, for example. Alternatively, the terminating ends of the stop member fingers as employed in the device 10, may be readily reduced in cross-section so as to even allow point contact to be made with any given socket housing, if required, in a critical space-limiting application.

Still another advantage in having the two comb-like arrays of stop member fingers 51a, 52a at least partially interleaved with the respectively associated arrays of gripping jaw segments 31a, 32a, is that the respective fingers in each array are then not only necessarily aligned with, but advantageously may be readily positioned so as to provide support for, the respectively aligned leads 14, if desired. To that end, and in accordance with another aspect of the invention, each of the fingers 51a and 52a may optionally be modified, as illustrated by the pair of commonly designated fingers 51a" in FIG. 10, to include a longitudinally extending groove 61 which communicates with the inner surface thereof.

Such grooves may advantageously be used to effect three-sided support for relatively fragile circuit module leads, when of the type that extend downwardly from the sides of a substrate 13, as illustrated (or from any other body portion of a circuit module), during a circuit module lead insertion or extraction operation. Considered more specifically, the optionally grooved stop member fingers 51a" may be advantageously employed in the illustrative device embodiments to maintain fragile circuit module leads precisely spaced and straight, while simultaneously facilitating the guiding thereof into the respectively aligned socket receptacles, in response to a given circuit module being moved downwardly from the position depicted in FIG. 4, for example, to that of FIG. 3.

In connection with the many possible configurations for the stop member fingers, as well as possible variations in their positioning relative to the jaw segments, it should be appreciated that each of the sidewall stop members 51, 52 is secured to the cross-member 54 by only two threaded fastening members 58. Thus, stop members with differently dimensioned and/or configured stop fingers may be readily interchanged so as to facilitate the insertion and/or extraction of different types and codes of circuit modules from aligned sockets (or connectors). Such interchangeability, for the same reasons, likewise applies to the pivotal gripping jaws 31, 32, which are respectively mounted on opposite sides of the support member 34 by the aforementioned pairs of pins 36 or 37.

As best seen in FIG. 5, the integrally connected sidewall stop members 51, 52 and end plates 56, 57 are also dimensioned so as to define an enclosure that closely confines the gripping jaw assembly 20 and, in particular, the support member 34 thereof, so as to insure only linear displacement therebetween. Such displacement is assured, however, even when only one end plate is employed, by the manner in which the stationary and moveable assemblies of the device are intercoupled by the wheel puller mechanism 30, as will shortly be described. Thus, while one or more mating surfaces of the two assemblies could additionally be adapted to allow keyway guided displacement therebetween, such specially machined mating surfaces are not necessary in the device as constructed.

With reference again to the end plates 56, 57, the spacing therebetween is preferably chosen so that the lower bifurcated ends 56a thereof closely confine the substrate 13 along the non-leaded edges thereof. This insures precise interleaved positioning of the gripping jaw segments 31a, 32a relative to the respectively adjacent substrate-supported leads 14. In this regard, however, it should be noted that as only one of the end plates is required for structural rigidity of the device 10, it has been found advantageous in certain circuit module extraction applications, in particular, to use only one of the end plates.

This allows the lower ends of the stop member fingers 51a, 52a, while the gripping jaw segments 31a, 32a are manually biased outwardly, to be more quickly and easily positioned on the respective upper surfaces of a given pair of circuit module-supporting sockets 16, without concern initially for establishing precise lateral alignment therebetween. Acquiring such alignment, which results in the gripping jaw segments 31a, 32a in each array thereof being brought into interleaved relationship with the associated array of substrate leads 14, can be easily established by simply shifting the device 10 laterally, while resting on the socket housings, in a direction until the bifurcated ends 56a of the single end plate 56, for example, abuts against the adjacent non-terminal edge of the circuit module substrate 13, as best seen in FIG. 3.

It should be appreciated that the lower extending portion(s) of the end plates may be configured in any one of a number of ways to accomplish the desired results. The bifurcated end plate profile has the additional advantage of providing a relatively large open central region that allows an operator at any time to visually observe the spatial relationship of the jaw segments and/or stop member fingers relative to a circuit module and/or a pair of associated sockets.

With reference again to the manually actuated handle portions 31b, 32b of the gripping jaws, in the first illustrative embodiment of the device 10, as best seen in FIGS. 1 and 5, the maximum and minimum spacings between the two arrays of jaw segments 31a and 32a are determined by respective openings defined, in part, by the depth of separate recessed areas 63 and 64 formed in the upper portions of the stop members 51 and 52, and by the length of respectively associated co-extensive recessed areas 66 and 67 formed in the cross-member 54. However, in practice, the actual inwardly directed, spring-biased minimum quiescent spacing between the lower jaw segments 31a and 32a is preferably adjustably controlled by respectively associated stop pins 68, 69. Pin 68 is threadably inserted within a bore formed in the upper portion of the stop member 51, with the pin 69 being inserted within a corresponding bore formed in the stop member 52 (best seen in FIGS. 1, 3 and 5).

A stop pin 81, best seen in FIGS. 3 and 4, is threadably inserted in a bore of the cross-member 54, and allows control over the retractable displacement of the jaw assembly 20 relative to the composite frame and support member assembly 25.

In accordance with another aspect of the invention, the aforementioned briefly described wheel puller mechanism 30 comprises a rod 71 (best seen in FIG. 1) that is supported along an intermediate portion thereof by an upper coller 73, mounted on the top side of the cross-member 54 of the composite frame and stop member assembly 25, and by a closely spaced collar 74 nested within a circular recess 76 formed in the underside surface of the cross member.

A lower threaded portion 71a of the rod 71 is adapted to extend through and engage a threaded bore centrally formed in the support member 34 of the gripping jaw assembly 20. A flange 77 is secured to the lower terminating end of the threaded rod 71, and is nested within a circular recess 78 formed in the underside of the support member 34. A circular knob 79, preferably having a knurled outer surface, is secured to the upper end of the rod 71, such as by means of a fastening element 82, so as to allow manually imparted rotation of the rod 71 in either direction.

As thus constructed, the wheel puller mechanism 30, in response to the threaded rod 71 thereof being rotated in either direction, will effect either upward or downward displacement of the jaw assembly 20, and any circuit module 12 gripped between the jaws thereof, relative to the stationary composite frame and stop member assembly 25, with such relative displacement being precisely controlled, and always maintained in a linear direction.

A typical operating application of the device 10 will now be more fully described, by way of example only, with respect to a circuit module lead extraction operation, which operation is also illustrated in sequence in FIGS. 3 and 4.

Initially, the upper handle portions 31b, 32b of the gripping jaws are grasped, and upon light compressive force being exerted thereagainst, they are pivoted slightly toward each other to the relative positions depicted in phantom in FIG. 3. Those handle positions are acquired either before or as the device 10 is lowered until the terminating ends of the stop member fingers 51a and 52a in the respective arrays thereof abut against the upper surface of the housing of the associated one of the pair of circuit board-mounted sockets 16. Thereafter, manual compressive force is removed from the handle portions of the gripping jaws, resulting in the two arrays of gripping jaw segments 31a and 32a pivotally moving inwardly, under spring bias, until the respective notches 46 and 47 therein nest different longitudinally spaced peripheral edge portions of the circuit module substrate 13 (or body portion of any other type of circuit module).

At that time, the relative positions of the stationary and moveable parts of the device 10, with respect to the gripped and socket-secured circuit module substrate 13, are depicted in FIG. 3. With the device 10 thus positioned, the hand-operated knob 79 of the wheel-puller mechanism 30 is rotated counter-clockwise, for example, which causes the support member 34, together with the mutually disposed gripping jaws 31, 32 pivotally mounted thereon, and the substrate-supported circuit module 12 clamped between the jaws, to be moved linearly upward relative to the composite frame and stop member assembly 25 until reaching the position depicted in FIG. 4, for example.

Upon the substrate-supported circuit module 12 having been extracted from the aligned pair of sockets 16, the device 10 is manually lifted off of the sockets 16. The substrate is thereafter readily released from the two arrays of jaw segments 31a, 32a by an operator once more simply exerting sufficient compressive force against the upper handle portions 31b, 32b of the gripping jaws to again move them to the relative positions depicted in phantom in FIG. 3.

It should be understood that in utilizing the device 10 to insert (as distinguished from extract) the leads of a given circuit module into aligned circuit board-mounted sockets, the sequence of operations described above would simply be reversed.

FIGS. 8 and 9 illustrate a second preferred embodiment of the invention wherein a device 90 distinguishes over the device 10 of FIGS. 1-7 by utilizing two T-shaped handles 91 and 92 that respectively form integral extensions of gripping jaws 31' and 32'. The vertically oriented portions of the handles 91 and 92 are pivotally displaceable within respective openings defined, in part by the depth of separate recessed areas 94 and 95 formed in sidewall stop members 51a' and 52a', and by the depth of respectively associated co-extensive cutouts 96 and 97 formed in the interconnecting cross-member 54'.

As depicted in FIG. 9, a stop pin 98 is threadably inserted within a bore extending through an upper portion of the stop member 52', and a stop pin 99 is threadably inserted within a bore extending through the vertically extending portion of the handle 92, with the latter pin being exposed for adjustment by an aligned hole 101 formed through the stop member 52'. A pair of similarly mounted stop pins (not seen) are associated with the handle 91. With particular reference to the handle 92, the associated stop pins 98 and 99 are seen to provide adjustable control over the outward and inward displacement respectively thereof. Pivotal movement of the lower integral jaw 32' would, of course, be similarly controlled, but with the directions of adjustable displacement being reversed.

In all other respects, the device 90 is structurally identical to the device 10, and operates in the same manner. Thus, all of the illustrated parts in the device 90 are identified by like, but primed reference numerals, and need not be further described herein.

While two preferred device embodiments have been disclosed herein for inserting or removing multi-leaded circuit modules into and out of aligned lead-engaging substrate-supported sockets (or connectors), it is obvious that various modifications may be made to the present illustrative claimed embodiments of the invention, and that a number of alternative related embodiments could be devised by one skilled in the art without departing from the spirit and scope of the invention.

What is claimed is:

1. A device for selectively inserting the leads of circuit modules into and withdrawing them from lead-engaging sockets secured to an associated substrate, said device comprising:

a gripping jaw assembly including a support member and a mutually disposed pair of gripping jaws, means mounting said jaws pivotally on said support member and spring means for biasing said jaws in a direction toward each other, with each of said jaws having a corresponding notch formed in the inner surface thereof for receiving and supporting a peripheral edge portion of a circuit module when positioned between and gripped by said jaws;

a stationary support assembly including a mutually disposed pair of sidewall members for receiving the gripping jaw assembly therebetween, each of said sidewall members having a downwardly extending finger positioned adjacent a different one of said gripping jaws, and being formed at the lower end thereof to be selectively supported on an aligned socket, even when the socket is positioned beneath the associated jaw, and on an associated socket-supporting substrate, means on said sidewall members for engaging the gripping jaws to hold said gripping jaws against said biasing means in position adjacent to said fingers, and for linear movement relative to said fingers;

means extending from said jaws for pivoting said jaws away from said engaging means and against said biasing means to move said jaw notches away from each other to receive the peripheral edge at the circuit module; and an actuable mechanism mounted on said stationary support assembly, coupled to said gripping jaw assembly, and having means moveable, in one of two directions, to impart precisely controlled linear displacement of said gripping jaws, and a given circuit module when clamped therebetween, in a related direction relative to said stationary support assembly while said fingers engage and hold the sockets.

2. A device in accordance with claim 1 wherein a lower terminating end portion of each of said jaws is formed into a comb-like array of jaw segments, with each segment having a different one of said circuit module-supporting notches formed therein, the array of segments of each jaw also being dimensioned and spaced so as to allow each notched segment to grip a circuit module along a peripheral edge portion thereof defined between a different adjacent pair of an array of circuit leads when extending downwardly from the common side of such a gripped circuit module, and wherein said stationary support assembly further includes a cross-member, with said associated sidewall members being respectively secured to opposite sides of the latter, each of said sidewall members further having a lower terminating end portion formed into a comb-like array of downwardly extending fingers, the latter being dimensioned and spaced such that each array thereof is at least positioned in offset relationship with respect to said associated array of jaw segments.

3. A device in accordance with claim 2 wherein said actuable mechanism is rotatably mounted on said cross member of said stationary support assembly, and includes a downwardly extending rod portion that extends through and threadably engages a centrally located bore formed in said support member of said gripping jaw assembly, said rod portion when rotated in a predetermined direction effecting the linear displacement in a predetermined direction of said gripping jaws, and a circuit module when gripped therebetween, relative to said stop members, said controlled displacement thereby allowing the selective insertion and extraction of the leads of such a gripped circuit module into and out of respectively aligned socket receptacles upon the terminating ends of each array of stop member fingers also being commonly brought into abutting relationship selectively with an associated socket and supporting substrate therefor.

4. A device in accordance with claim 2 wherein said jaw pivoting means comprise an upwardly extending handle portion on each gripping jaw, with said corresponding handle portions being positioned relative to each other so as to allow their being manually grasped, and compressive force exerted thereagainst so as to displace them inwardly toward each other, in opposition to the normal biasing forces exerted thereagainst, to increase the spacing between said segmented jaws sufficiently to allow circuit modules of different widths to be interposed and temporarily clamped therebetween.

5. A device in accordance with claim 4 wherein each of said pivotal jaws is spring-biased outwardly by said spring means abutting thereagainst, each of said spring means being partially nested within a different receiving bore formed in said support member of said gripping jaw assembly, and wherein said device further includes means for adjusting at least the normal minimum spacing between the segmented portions of said pivotal gripping jaws.

6. A device in accordance with claim 3 wherein each of said pivotal jaws is spring-biased outwardly by said spring means abutting thereagainst, wherein said actuable puller mechanism further includes a circular knob at the upper end of said threaded rod for manual grasping to effect the rotation thereof, and wherein said device further includes means for adjusting the position of said gripping jaw engaging means to set both the normal maximum and minimum spacings between the segmented portions of said pivotal gripping jaws.

7. A device in accordance with claim 2 wherein each array of stop member fingers is arranged so as to be in at least partially interleaved relationship with the associated array of jaw segments, and wherein the length of said fingers in each array are chosen such that only the terminating ends thereof rest upon the upper surface of the housing of an associated socket when aligned therewith.

8. A device in accordance with claim 2 wherein a longitudinally extending lead-receiving groove is formed in, and communicates with the inner surface of, each of said stop member fingers, each finger of each array being positioned between a different pair of jaw segments in the associated array thereof such that each finger groove will at least partially confine, and guide a different one of an adjacent array of peripherally exposed and downwardly extending leads of a circuit module when the latter is gripped between said two arrays of jaw segments and displaced thereby relative to said two respectively associated arrays of stop member fingers.

9. A device in accordance with claim 7 wherein a longitudinally extending lead-receiving groove is formed in, and communicates with the inner surface of, each of said stop member fingers, each finger of each array being positioned between a different pair of jaw segments in the associated array thereof such that each finger groove will at least partially confine, and guide a different one of an adjacent array of peripherally exposed and downwardly extending leads of a circuit module when the latter is gripped between said two arrays of jaw segments and displaced thereby relative to said two arrays of stop member fingers.

10. A device for selectively inserting the leads of multi-leaded circuit modules into and withdrawing them from lead-engaging sockets secured to an associated substrate, said device comprising:
a gripping jaw assembly including a support member, and a mutually disposed pair of longitudinally extending gripping jaws pivotally mounted on said support member and biased in a direction toward each other, a lower terminating end portion of each jaw being formed into a longitudinally disposed comb-like array of jaw segments, the jaw segments being shaped to grip different peripheral regions of a circuit module when positioned between said jaws, and to respectively extend between different adjacent pairs of an array of circuit leads when extending downwardly from a marginal side of a gripped circuit module;
a stationary support assembly including a cross member and a mutually disposed pair of socket-abutting stop members respectively secured to opposite sides of said cross member, each of said stop members having a lower terminating end portion formed into a longitudinally disposed comb-like array of downwardly extending fingers, said fingers in each array being dimensioned and spaced to interleave with said associated array of gripping jaw segments,
each of said stop member fingers being formed with an axially disposed groove of predetermined dimensions to substantially confine and facilitate the guiding of a circuit module lead into a receiving socket receptacle,
and an actuable wheel-puller mechanism rotatably mounted on said cross member of said stationary support assembly, and having a downwardly extending rod portion coupled to said gripping jaw assembly, said rod portion having means thereon which are effective to cause, when rotated in a predetermined direction, the displacement of said gripping jaws, and a circuit module when gripped therebetween, relative to said stop members in a desired direction to allow the selective insertion and extraction of the leads of such a gripped circuit module into and out of respectively aligned receptacles of a related substrate-supported socket.

11. A device in accordance with claim 10 further including means for adjusting both the maximum and minimum separation that can normally exist between the lower segmented jaw portions.

* * * * *